United States Patent [19]

Peter et al.

[11] Patent Number: 4,951,302
[45] Date of Patent: Aug. 21, 1990

[54] CHARGE-COUPLED DEVICE SHIFT REGISTER

[75] Inventors: Joseph R. Peter; Raymond Hayes, both of Beaverton, Oreg.

[73] Assignee: Tektronix, Inc., Beaverton, Oreg.

[21] Appl. No.: 213,554

[22] Filed: Jun. 30, 1988

[51] Int. Cl.$^5$ .................... H03K 23/46; H03K 5/159; G11C 11/34
[52] U.S. Cl. ........................................ 377/57; 377/60; 377/67; 307/607; 365/183; 365/219
[58] Field of Search ........................ 377/57, 60, 61, 62, 377/63, 54, 64, 67, 78; 307/607; 365/183, 219, 238; 357/24, 24 M

[56] References Cited

U.S. PATENT DOCUMENTS

| | | | |
|---|---|---|---|
| 3,913,077 | 10/1975 | Erb | 377/63 |
| 3,918,070 | 11/1975 | Shannon | 377/62 |
| 3,944,990 | 3/1976 | Chou | 377/58 |
| 4,093,872 | 6/1978 | Hartman et al. | 377/57 |
| 4,118,795 | 10/1978 | Frye et al. | 377/60 |
| 4,205,283 | 5/1980 | Donnally, Jr. | 377/62 |
| 4,211,937 | 7/1980 | Kohyama | 377/67 |
| 4,223,233 | 9/1980 | Cappon et al. | 377/67 |
| 4,508,975 | 4/1985 | Rockett, Jr. | 377/63 |
| 4,521,896 | 6/1985 | Borsuk et al. | 377/60 |
| 4,648,072 | 3/1987 | Hayes et al. | 377/57 |

Primary Examiner—John S. Heyman
Assistant Examiner—Tai V. Duong
Attorney, Agent, or Firm—John Smith-Hill; Peter J. Meza

[57] ABSTRACT

A two phase shift register comprises four serial registers each having an input section, a transfer section, and a lead-in section disposed between the input section and the transfer section. The input sections provide respective sequences of charge samples, the four sequences being offset in phase relative to each other by 90° within the cycle of a clock signal. At least one of the serial registers comprises a first lead-in gate pair and a second lead-in gate pair over the lead-in section, the second lead-in gate pair being between the first lead-in gate pair and the transfer section. The first lead-in gate pair and the second lead-in gate pair are each driven at the frequency of the clock signal, the drive signal applied to the second lead-in gate pair being retarded in phase relative to that applied to the first lead-in gate pair by 90° within the cycle of the clock signal.

4 Claims, 2 Drawing Sheets

CHARGE-COUPLED DEVICE SHIFT REGISTER

BACKGROUND OF THE INVENTION

This invention relates to a charge-coupled device (CCD) shift register.

It is known to use a CCD array as a serial-parallel-serial (SPS) analog shift register for high speed signal acquisition.

An SPS analog shift register comprises an input serial register, an output serial register, and a parallel register that connects the input serial register to the output serial register. The parallel register is composed of multiple segments, each comprising a serial register, extending between the input register and the output register. An input signal is sampled at an input diode of the SPS shift register and consecutive samples are shifted through the input register. When the input register is full, the samples are shifted into respective segments of the parallel register, emptying the input register. The input register is filled and emptied again, and as each group of samples is shifted into the parallel register the samples that were previously shifted into the parallel register are advanced by one step through the parallel register. Ultimately, each group of samples reaches the output register, and is shifted serially through the output register to an output node of the SPS shift register.

U.S. Pat. No. 4,725,748 issued Feb. 16, 1988 (Hayes, et al) discloses a two-channel SPS analog shift register using a four-phase CCD fabricated on a p-type silicon die having an n-type buried channel region The input signal is sampled at input diodes of the two channels respectively, by sampling clocks that are of the same frequency but are 180° out of phase with each other, and the charge samples are applied to input registers of the two channels respectively. One of the channels has a lead-in section, which delays the samples taken at the input diode of that channel by one-half the sampling clock period. Therefore, each sample taken by the channel having the additional transfer electrodes enters the serial register of that channel at the same time that the next sample, which is taken by the other channel, enters the shift register of that other channel. Therefore, the two consecutive samples can be clocked through the respective channels simultaneously.

The effective sampling rate of the two-channel shift register shown in U.S. Pat. No. 4,725,748 is twice the transfer clock rate. The technique disclosed in U.S. Pat. No. 4,725,748 may be applied to a two-phase shift register. In the current state of the art, the maximum effective sampling rate that can be achieved using a two-channel shift register based on the teachings of U.S. Pat. No. 4,725,748 is about 500 Ms/s.

SUMMARY OF THE INVENTION

A preferred embodiment of the present invention in its first aspect is a charge-transfer register comprising a die of semiconductor material having a buried channel region therein, and first gate means and second gate means overlying the buried channel region, the electron potential energy in the buried channel region defining both a potential well and a potential barrier beneath each of the first gate means and the second gate means. The register also comprises means for driving the first gate means and the second gate means with drive signals that are both of the same frequency and are out of phase by an angle that is substantially less than 180°.

A preferred embodiment of the present invention in its second aspect is a shift register comprising four serial registers each having an input section, a transfer section, and a lead-in section disposed between the input section and the transfer section. The input sections provide respective sequences of charge samples, the four sequences being offset in phase relative to each other by 90° within the cycle of a clock signal. At least one of the serial registers comprises at least first lead-in gate means and second lead-in gate means over the lead-in section, the second lead-in gate means being between the first lead-in gate means and the transfer section. The first lead-in gate means and the second lead-in gate means are each driven at the frequency of the clock signal, the drive signal applied to the second lead-in gate means being retarded in phase relative to that applied to the first lead-in gate means by 90° within the cycle of the clock signal.

A preferred embodiment of the present invention in its third aspect is a shift register comprising four serial registers each having an input section, a transfer section, and a lead-in section disposed between the input section and the transfer section. The input sections provide respective sequences of charge samples, the four sequences being offset in phase relative to each other by 90° within the cycle of a clock signal Each serial register comprises at least first and second sets of transfer gates in cyclically repeating sequence over the transfer section, with the first gate of the first set nearer to the input section than any gate of the second set. At least one of the serial registers comprises at least first lead-in gate means and second lead-in gate means over the lead-in section, the second lead-in gate means being between the first lead-in gate means and the transfer section. The transfer gates are driven at the frequency of the clock signal, and the first lead-in gate means and the second lead-in gate means are each driven at the frequency of the clock signal. The drive signal applied to the second lead-in gate means is retarded in phase relative to that applied to the first lead-in gate means by 90° within the cycle of the clock signal.

BRIEF DESCRIPTION OF THE DRAWINGS

For a better understanding of the invention, and to show how the same may be carried into effect, reference will now be made, by way of example, to the accompanying drawings in which.

DETAILED DESCRIPTION

Figure 1:
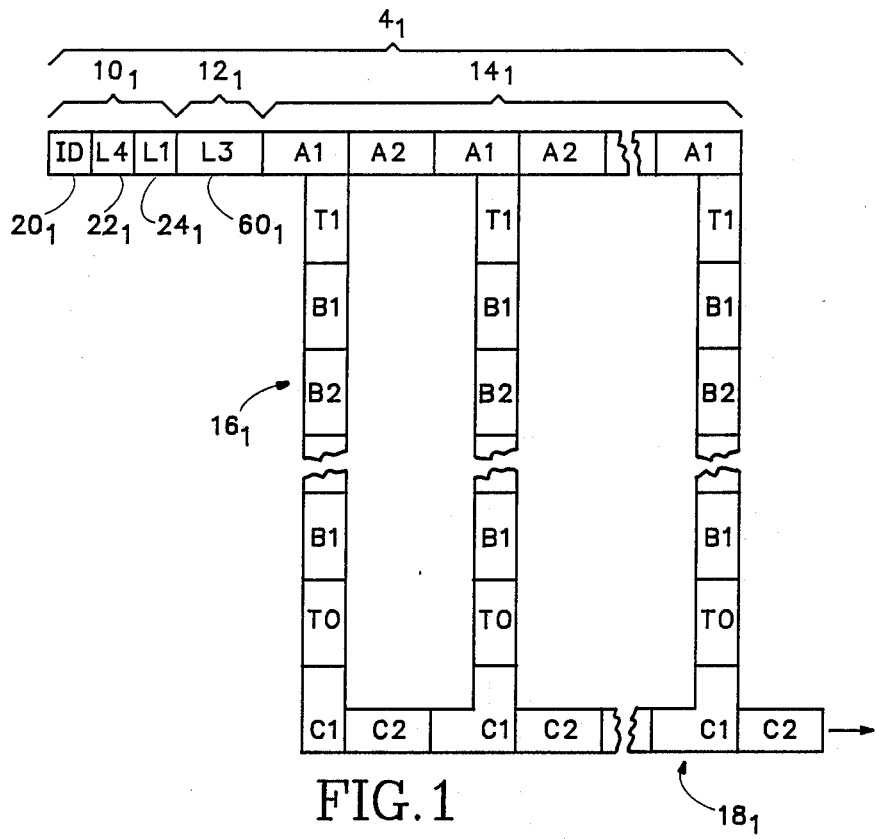
FIG. 1 is a schematic top plan view of a portion of an integrated circuit.
Figure 2:
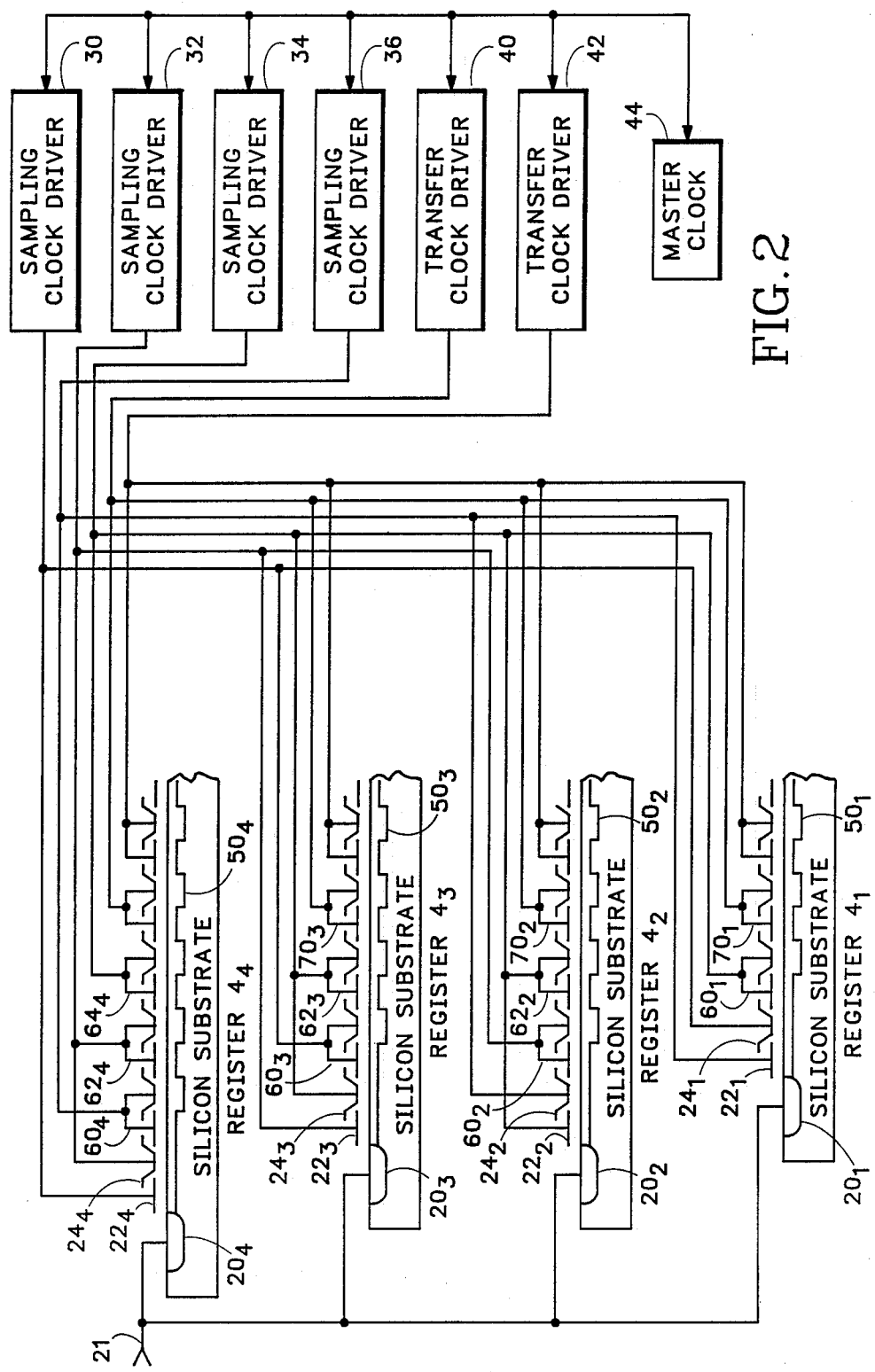
FIG. 2 is a sectional view of part of that portion of the integrated circuit shown in FIG. 1, and also illustrates parts of three other portions of the integrated circuit.

The integrated circuit shown in FIGS. 1 and 2 comprises a die of p-type silicon formed with four n-type buried channel regions. The four buried channel regions are used to implement a two-phase four-channel SPS CCD shift register. To facilitate description of the shift register, the subscripts 1, 2, 3 and 4 are used in connection with the four signal channels respectively of the shift register.

Each signal channel of the SPS shift register comprises an input serial register 4, a parallel register 16 and an output serial register 18. Part of the input serial register 4 of each of the four channels is shown in FIG. 2. The four input serial registers $4_1 \ldots 4_4$ each have an input section 10, a lead-in section 12 and a transfer section 14. The transfer sections of the four input serial registers respectively are identical and may be implemented in conventional manner. The input serial register $4_1$, the parallel register $16_1$ and the output serial register $18_1$ of one signal channel are shown in FIG. 1. The parallel registers and the output serial registers of the four signal channels are identical and may be implemented in conventional manner.

Figure 3:
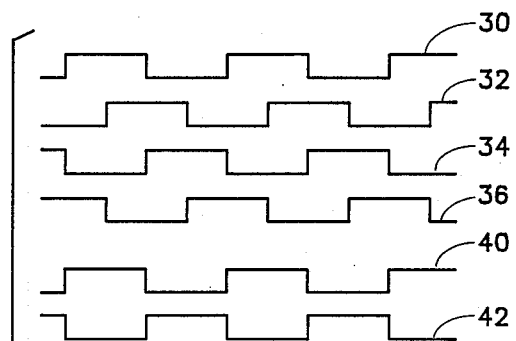
FIG. 3 illustrates the waveforms of drive signals that are applied to gates of the integrated circuit.

The part of the buried channel region that is used to implement the input serial register $4_1$ extends from an n+ diffusion $20_1$. The diffusion $20_1$ is an input diffusion, which is connected to an input terminal 21 at which the SPS shift register receives a single-ended input signal. Conductive gates are formed over the buried channel region. The gates are in five sets, designated A, B, C, L and T in FIG. 1. The gates are connected to clock drivers, some of which are shown in FIG. 2. The clock drivers shown in FIG. 2 comprise sampling clock drivers 30–36 and transfer clock drivers 40 and 42. The sampling clock signals provided by the clock drivers 30–36 are of the same frequency, and the drivers 30–36 are controlled by a master clock clock 44 so that each sampling clock signal is offset in phase with respect to each of the other signals by an integral (non-zero) multiple of 90°. The transfer clock signals provided by the transfer clock drivers 40 and 42 are of the same frequency as the clock signals provided by the drivers 30–36, and the transfer clock drivers are controlled so that the signals provided by the drivers 40 and 42 are in phase with the signals provided by the drivers 30 and 34 respectively. The waveforms of of the clock signals provided by the drivers 30–36, 40 and 42 are shown in FIG. 3.

The first and second gates 22 and 24 of each serial register 4 are in the input section 10 and each such gate is connected to one of the sampling clock drivers 30–36. The lead-in section of each register includes at least two gates. The gates in the lead-in section are connected in pairs, and each such gate pair is connected to one of the sampling clock drivers 30–36. There is one gate pair in the lead-in section of the channel $2_1$, and there are two gate pairs in the lead-in section of each of the channels $2_2$ and $2_3$, and three gate pairs in the lead-in section of the channel $2_4$. There are multiple gate pairs in the transfer section, alternate gate pairs being connected to the transfer clock driver 40 and the transfer clock driver 42.

The conductive gates are made of polysilicon, and alternate gates are formed respectively from a lower level and an upper level of polysilicon, which are applied successively. This method of forming conductive gates is well known in the art. After the lower level gates are formed, and before the upper level gates are formed, an n implantation is carried out so that when the upper level gates have been formed, the electron potential energy beneath the upper level gates of the lead-in and transfer sections is lower than the electron potential energy beneath the lower level gates of those sections, as shown in FIG. 2 by the energy potential profiles $50_1 \ldots 50_4$. The electron potential energy beneath the upper and lower level gates of the input sections is the same as that beneath the lower level gates of the lead-in and transfer sections. This method of establishing variation in electron potential energy along the length of an n-type buried channel region by use of an n implantation is described in co-pending patent application Ser. No. 07/213,805 filed concurrently herewith (Attorney Docket No. USA 4743), now U.S. Pat. No. 4,862,235 the disclosure which is hereby incorporated by reference herein.

Considering, by way of example, the serial register $4_1$, when the drive signals provided by the drivers 30 and 36 are high, a conductive path is established in the buried channel region beneath the gates $22_1$ and $24_1$, and charge in the input diffusion $20_1$ diffuses along this conductive path. When the drive signal provided by the driver 36 goes low, the conductive path beneath the gate $22_1$ is broken, trapping a charge sample beneath the gate $24_1$. The quantity of charge that is trapped depends on the voltage of the input signal applied to the input terminal of the shift register. The first and second gates 22 and 24 of the other three serial registers $4_2$, $4_3$ and $4_4$ operate in similar fashion except that the sampling clock signals applied to the first and second gates of the other serial registers are shifted in phase with respect to those applied to the first and second gates of the register $4_1$. Accordingly, the four serial registers allow the input signal to be sampled at four times the frequency of the clock signals.

Referring again to the register $4_1$, the gate pair $60_1$ in the lead-in section is connected to the sampling clock driver 34, which provides a clock signal that is 180° out of phase with respect to that provided by the driver 30. Therefore, the sample beneath the gate $24_1$ of the input section is transferred to the well beneath the upper level gate of the gate pair $60_1$ when the signal applied to the gate $24_1$ goes low and the signal applied to the gate pair $60_1$ goes high. The signal provided by the driver 34 is 180° out of phase with respect to the signal provided by the driver 40, and therefore when the first gate pair $70_1$ of the transfer section goes high, the gate pair $60_1$ goes low and charge is transferred from the well of the lead-in section to the first well of the transfer section. The charge sample remains in the well of the lead-in section for one-half the period of the sampling clock.

In the case of the register $4_3$, the lead-in section has two gate pairs $60_3$ and $62_3$, and consequently two wells. The first gate pair $60_3$ is connected to the driver 30 and the second to the driver 34. When the gate $24_3$, which is connected to the driver 34, goes low, the first gate pair $60_3$ of the lead-in section goes high and the charge sample is transferred to the first well of the lead-in section. When the first gate pair $60_3$ goes low, the second gate pair $62_3$ goes high, and charge is transferred from the first well to the second well. When the second gate pair $62_3$ goes low, the first gate pair $70_3$ of the transfer section goes high and the charge is transferred from the second well of the lead-in section to the first well of the transfer section. Accordingly, the charge sample remains in the lead-in section for one period of the sampling clock.

In the case of the register $4_2$, the two gate pairs $60_2$ and $62_2$ of the lead-in section are connected to the drivers 32 and 34 respectively. The signal provided by the driver 32 is advanced in phase by 90° with respect to the signal provided by the driver 34. Therefore, when a charge sample is transferred from the first well of the lead-in section to the second well of the lead-in section, it only remains in the second well for one-quarter of the period of the sampling clock before being transferred to the first well of the transfer section. Accordingly, a charge sample remains in the lead-in section of the register $4_2$ for three-quarters of the sampling clock period.

In the case of the register $4_4$, which has three gate pairs $60_4$, $62_4$ and $64_4$ in its lead-in section, a charge sample remains in each of first and second wells of the lead-in section for one-half the clock period, but it remains in the third well of the lead-in section for only one-quarter of the clock period.

It will therefore be seen that if four samples are taken consecutively by the registers $4_4$, $4_3$, $4_2$ and $4_1$ respectively, the samples taken by the registers $4_4$, $4_3$ and $4_2$ are delayed by three-quarters period, one-half period and one-quarter period relative to the sample taken by the register $4_1$, and accordingly the four samples enter the transfer sections of the respective serial registers simultaneously. This allows the four samples to be clocked through the respective channels of the SPS register simultaneously, so that a single set of drivers can be used to perform charge transport, output resetting and output sampling functions for the four channels. By operating in this fashion, the input signal is sampled at four times the sampling clock frequency. Sample rates of 500 to 1000 Msamples/s can be achieved in this manner.

It will be appreciated that the present invention is not restricted to the particular embodiment that has been described and illustrated, and that variations may be made therein without departing from the scope of the invention as defined in the appended claims and equivalents thereof. In particular, it is not necessary that the electron potential energy profile be produced by use of an n implant, which provides wells in the buried channel region, and a p implant, which provides barriers, may be used instead. Also, although four sampling clock drivers are shown, they could be implemented as two sampling clock drivers with differential outputs. Although the invention has been described with reference to a single-ended input signal, a shift register for sampling a differential input signal may be fabricated by providing eight buried channel regions in the die, which each of the four signal channels of the shift register having a positive side and a negative side.

We claim:

1. A shift register comprising four serial registers each having an input section for providing a sequence of charge samples, the four sequences of charge samples provided by the input sections of the four serial registers respectively being offset in phase relative to each other by 90° within the cycle of a clock signal, a transfer section, and a lead-in section disposed between the input section and the transfer section, and at least one of the serial registers comprising:

at least first lead-in gate means and second lead-in gate means over the lead-in section, the second lead-in gate means being between the first lead-in gate means and the transfer section, and means for driving the first lead-in gate means and the second lead-in gate means each at the frequency of the clock signal, the drive signal applied to the second lead-in gate means being retarded in phase relative to that applied to the first lead-in gate means by 90° within the cycle of the clock signal.

wherein a first serial register comprises first lead-in gate means, a second serial register and a third serial register each comprise first lead-in gate means and second lead-in gate means, and a fourth serial register comprises first lead-in gage means, second lead-in gate means and third lead-in gate means.

2. A register according to claim 1, wherein the lead-in gate means each comprise first and second gates which are mutually adjacent and are connected together.

3. A register according to claim 1, wherein the shift register comprises means for driving each of the lead-in gate means at the same frequency as the clock signal, the drive signals applied to the second lead-in gate means of the second register and the second lead-in gate means of the third register being in phase with the drive signal applied to the lead-in gate means of the first register, the drive signal applied to the first lead-in gate means of the third register being 180° out of phase with the drive signal applied to the lead-in gate means of the first register, the drive signal applied to the first lead-in gate means of the second register being advanced in phase by 90° relative to that applied to the second lead-in gate means of the second register, and the drive signal applied to the second lead-in gate means of the fourth register being in phase with the drive signal applied to the first lead-in gate means of the second register, 180° out of phase with the drive signal applied to the first lead-in gate means of the fourth register, and retarded in phase by 90° relative to that applied to the third lead-in gate means of the fourth register.

4. A shift register according to claim 1, wherein the input sections each comprise an input node connected to an input terminal of the shift register, gate means interposed between the input node and the lead-in section of the register, and the means for driving the gate means at the frequency of the clock signal, the drive signals applied to the gate means of the four serial registers respectively being offset in phase relative to each other by 90° within the cycle of the clock signal.

* * * * *